(12) United States Patent
Narasimhan et al.

(10) Patent No.: US 7,643,290 B1
(45) Date of Patent: Jan. 5, 2010

(54) TECHNIQUES UTILIZING THERMAL, EMI AND FIPS FRIENDLY ELECTRONIC MODULES

(75) Inventors: Susheela N. Narasimhan, Milpitas, CA (US); Hang Tran, San Jose, CA (US); Branimir Tasic, Menlo Park, CA (US); John Borg, Boxborough, MA (US); Wingo Cheong, San Jose, CA (US); Nguyen Nguyen, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 12/178,060

(22) Filed: Jul. 23, 2008

(51) Int. Cl.
*H05K 7/20* (2006.01)

(52) U.S. Cl. .................. 361/690; 361/695; 361/697; 361/724; 361/727; 454/184

(58) Field of Classification Search ............ 361/679.01, 361/679.46, 690–697, 715, 720–727, 752, 361/800, 816, 818, 831; 165/104.33, 104.34, 165/122, 126, 185; 174/15.1, 16.1, 16.3, 174/17 R; 454/60, 184, 206; 312/223.1, 312/223.2, 236; 211/26, 153, 134
See application file for complete search history.

(56) References Cited

U.S. PATENT DOCUMENTS

| | | | |
|---|---|---|---|
| 5,063,477 A * | 11/1991 | Paggen et al. | 361/695 |
| 6,457,949 B1 | 10/2002 | Bendikas et al. | |
| 6,512,672 B1 * | 1/2003 | Chen | 361/695 |
| 6,574,100 B1 * | 6/2003 | Anderson | 361/679.5 |
| 6,594,148 B1 | 7/2003 | Nguyen et al. | |
| 6,717,807 B2 * | 4/2004 | Hikawa | 361/690 |
| 7,016,193 B1 * | 3/2006 | Jacques et al. | 361/695 |
| 7,164,581 B2 | 1/2007 | Carullo et al. | |
| 7,403,385 B2 | 7/2008 | Boone et al. | |
| 7,430,117 B2 | 9/2008 | Shabany | |
| 2008/0174948 A1 * | 7/2008 | Davis | 361/684 |
| 2009/0129014 A1 * | 5/2009 | Larsen et al. | 361/692 |

\* cited by examiner

*Primary Examiner*—Michael V Datskovskiy
(74) *Attorney, Agent, or Firm*—BainwoodHuang

(57) ABSTRACT

An electronic system includes a chassis defining a substantially plane-shaped cavity. The chassis is arranged to contain an air stream (e.g., provided by a cooling subsystem) which flows from an air intake side of the chassis to an air exhaust side of the chassis through the substantially plane-shaped cavity. The air intake side of the chassis is opposite the air exhaust side of the chassis. The electronic system further includes a jacket circuit board disposed within the plane-shaped cavity, and a set of pluggable electronic modules. The jacket circuit board is oriented within the plane-shaped cavity to receive cooling from the air stream. Each pluggable electronic module is arranged to (i) electronically connect to the jacket circuit board through a front of the chassis and (ii) define a supplemental ventilation port through which air passes to augment the air stream.

20 Claims, 8 Drawing Sheets

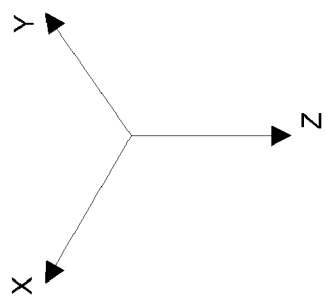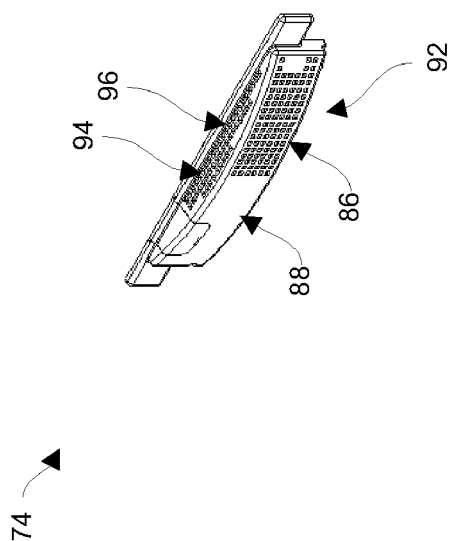
FIG. 7

TECHNIQUES UTILIZING THERMAL, EMI AND FIPS FRIENDLY ELECTRONIC MODULES

BACKGROUND

A variety of constraints may exist on a particular electronic device. For example, the circuitry of the electronic device may be required to operate within a certain temperature range or otherwise risk the possibility of improper operation or damage. As another example, the electronic device may need to comply with certain electromagnetic interference (EMI) requirements.

More recently, attention has been paid to developing and imposing various security standards. Examples of such standards include the Federal Information Processing Standards (FIPS) which relate to cryptographic modules used in security systems which protect unclassified information within information technology (IT) systems.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

FIG. 7 is a detailed perspective view of a bezel of the pluggable electronic module.

DETAILED DESCRIPTION

Overview

Unfortunately, it is difficult to concurrently comply with multiple electronic constraints on an electronic device when certain characteristics of the device compete against each other. For example, for an existing electronic device, the current cooling resources may be sufficient to maintain the proper operating temperature of electronic circuitry within the device. However, such cooling resources may be inadequate to accommodate any upgrade to faster, higher power, components and thus hotter electronic circuitry without some other modification to the cooling subsystem of the device (e.g., a costly upgrade of the fans and the fans' power sources).

Moreover, if additional cooling ducts were simply added to the device's housing, such cooling ducts could move the device out of compliance with various other requirements such as EMI and FIPS requirements. In particular, if existing cooling ducts are made larger, such ducts could become a source of EMI leakage and/or a security threat.

Advantageously, an improved electronic system utilizes a set of thermal, EMI and FIPS friendly electronic modules which are capable of maintaining EMI and FIPS protection as well as providing supplemental ventilation though which air passes to augment an air stream within the system. Such a system enjoys robust and reliable compliance with thermal, EMI and FIPS requirements during operation.

One embodiment is directed to an electronic system which includes a chassis defining a substantially plane-shaped cavity. The chassis is arranged to contain an air stream (e.g., provided by a cooling subsystem formed by fan and filter assemblies) which flows from an air intake side of the chassis to an air exhaust side of the chassis through the substantially plane-shaped cavity. The air intake side of the chassis is opposite the air exhaust side of the chassis. The electronic system further includes a jacket circuit board disposed within the plane-shaped cavity, and a set of pluggable electronic modules. The jacket circuit board is oriented within the plane-shaped cavity to receive cooling from the air stream. Each pluggable electronic module is arranged to (i) electronically connect to the jacket circuit board through a front of the chassis and (ii) define a supplemental ventilation port through which air passes to augment the air stream.

DESCRIPTION OF EXAMPLE EMBODIMENTS

Figure 1:
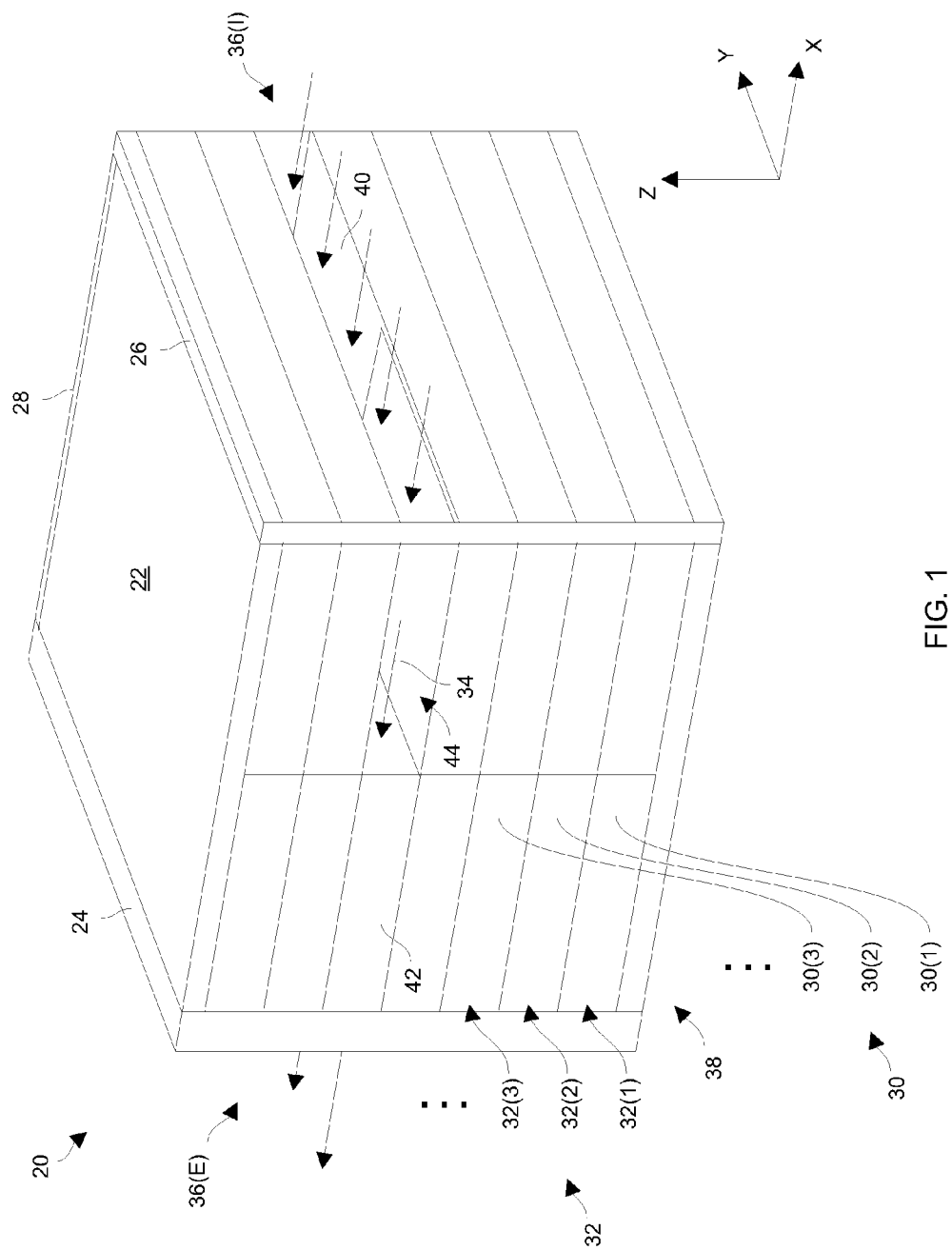
FIG. 1 is a general perspective view of an electronic system which utilizes a set of thermal, EMI and FIPS friendly electronic modules.

FIG. 1 is a perspective view of an electronic system 20 which is constructed and arranged to perform a set of electronic operations. Such operations may include general purpose operations (e.g., general communications, general computations, read and write operations, etc.), specialized operations (e.g., complex calculations, measurement sensing/sampling, complex data processing, graphical display, etc.), and/or combinations thereof. By way of example, the electronic system 20 is described below as a high-speed network switch or a similar data communications device which is adapted to guide data elements such as TCP/IP packets within a computerized network.

As shown in FIG. 1, the electronic system 20 includes a chassis (or frame) 22, a fan assembly 24, a filter assembly 26, an interconnect 28, and a set of blade-style main electronic assemblies 30(1), 30(2), 30(3), . . . (collectively, main assemblies 30). The fan assembly 24 is arranged to draw air into and through the chassis 22 in order to remove heat from operating circuitry of the main electronic assemblies 30. The filter assembly 26 allows ambient air to flow into the chassis 22, as well as provides visual and electromagnetic interference (EMI) shielding (for illustration purposes, a portion of the filter assembly 26 is omitted in FIG. 1). The interconnect 28 (e.g., a backplane or midplane, a set of cable harnesses, etc.) is arranged to facilitate both power signal and data signal exchange with the main electronic assemblies 30 and/or to external devices.

As further shown in FIG. 1, the chassis 22 defines multiple plane-shaped cavities 32(1), 32(2), 32(3), . . . (collectively, cavities 32) to hold respective main electronic assemblies 30. In particular, with respect to each cavity 32, the chassis 22 is constructed and arranged to contain an air stream 34 which flows from an air intake side 36(I) of the chassis 22 to an air exhaust side 36(E) of the chassis 22 through that cavity 24. By way of example only, the cavities 32 are shown as stacking in the Z-direction, with each cavity 32 extending in the X-Y plane for side-to-side (e.g., right-to-left) flow of the air stream 34 substantially in the negative X-direction in FIG. 1.

Such an arrangement provides an efficient high density configuration for the operating electronic circuitry of the electronic system 20. Moreover, this arrangement enables a user (e.g., a technician) to conveniently access the main electronic assemblies 30 at a front 38 of the chassis 22. To this end, it should be understood that each main electronic assembly 30 includes a jacket circuit board 40 and multiple pluggable electronic modules 42. For illustration purposes, one of the pluggable electronic modules 42 is omitted at location 44 in FIG. 1. As will be described in further detail shortly, each pluggable electronic module 42 is thermal, EMI and FIPS friendly. Further details will now be provided with reference to FIG. 2.

Figure 2:
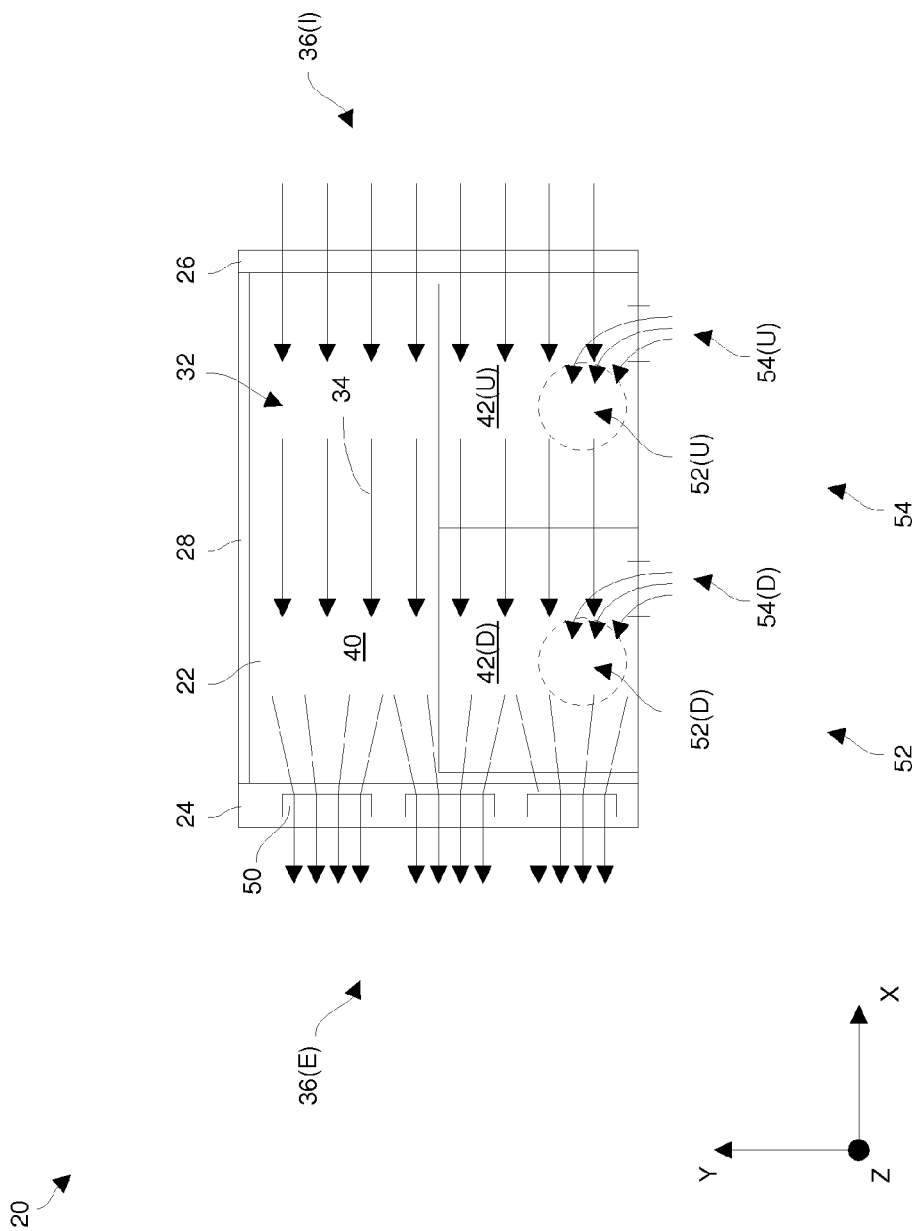
FIG. 2 is a cross-sectional top view of the electronic system of FIG. 1 showing air flow patterns through the electronic system.

FIG. 2 is a cross-sectional top view of the electronic system 20 showing general air flow patterns through a particular cavity 32 defined by the chassis 22. As shown, the fan assembly 24 includes multiple fans 50 to generate the air stream 34 through the cavity 32. Although the fans 50 are shown exhausting air from the cavity 32, alternatively the fans 50 may push air into and through the cavity 32.

As further shown in FIG. 2, the main electronic assembly 32 includes a jacket circuit board 40, an upstream pluggable electronic module 42(U) and a downstream pluggable electronic module 42(D) (collectively, modules 42). The modules 42 abut each other in a side-by-side high-density manner when electronically connecting with the jacket circuit board 40 through the front 38 of the chassis 22.

When fully installed as shown in FIG. 2, the jacket circuit board 40 connects to the interconnect 28, and the modules 42 connect to the jacket circuit board 40 (also see FIG. 1). In particular, the upstream pluggable electronic module 42(U) resides proximate to the air intake side 36(I) of the chassis 22 and distal from the air exhaust side 36(E) of the chassis 22. In contrast, the downstream pluggable electronic module 42(D) resides proximate to the air exhaust side 36(E) and distal from the air intake side 36(I). In some arrangements, the modules 42 have the same configuration and/or are interchangeable, thus being primarily distinguishable by only their position (and perhaps software signaling) within the electronic system 20.

The jacket circuit board 40 is arranged for installation into the cavity 32 and removal from the cavity 32 through the front 38 of the chassis 22 (FIG. 1). When the jacket circuit board 40 resides within the cavity 32, the jacket circuit board lays relatively flat in the X-Y plane to enable the air stream 34 to flow in a laminar manner therethrough.

Similarly, the pluggable electronic modules 42 are arranged for installation into the cavity 32 and for removal from the cavity 32 through the front 38 of the chassis 22. When the pluggable electronic modules 42 reside side-by-side within the cavity 32, the pluggable electronic modules 42 lay relatively flat in the X-Y plane to enable circuitry of the modules 42 to enjoy and maintain the laminar flow of the air stream 34.

At this point, it should be understood that the pluggable electronic modules 42 may include thermally sensitive circuitry at particular locations, e.g., illustrated by the dashed circles 52(U), 52(D) (collectively, circuitry 52) in FIG. 2. For such circuitry 52, the air flow from the intake side 36(I) to the exhaust side 36 through the cavity 32 may be insufficient alone to provide proper cooling. Fortunately, the pluggable electronic modules 42 are arranged with supplemental ventilation ports 54 (i.e., port 54(U) for module 42(U) and port 54(D) for module 42(D)) through which air passes to augment the air stream 34. Such augmentation enhances heat removal from the thermally sensitive circuitry 52 at the particular locations thus enabling that circuitry 52 to remain within a proper and prescribed temperature range for correct operation.

It should be clear in FIG. 2 that the upstream pluggable electronic module 42(U) receives substantially fresh air through the filter 26 and the supplemental ventilation port 54(U). As a result, the circuitry 52(U) receives adequate cooling.

Additionally, the downstream pluggable electronic module 42(D) receives partially heated air that has passed by the upstream pluggable electronic module 42(U) and substantially fresh air through the supplemental ventilation port 54(D). This augmented flow of air through the downstream pluggable electronic module 42(D) provides adequate cooling as well so that the circuitry 52(D) remains within the normal operating temperature range. Further details will now be provided with reference to FIGS. 3 through 5.

Figure 3:
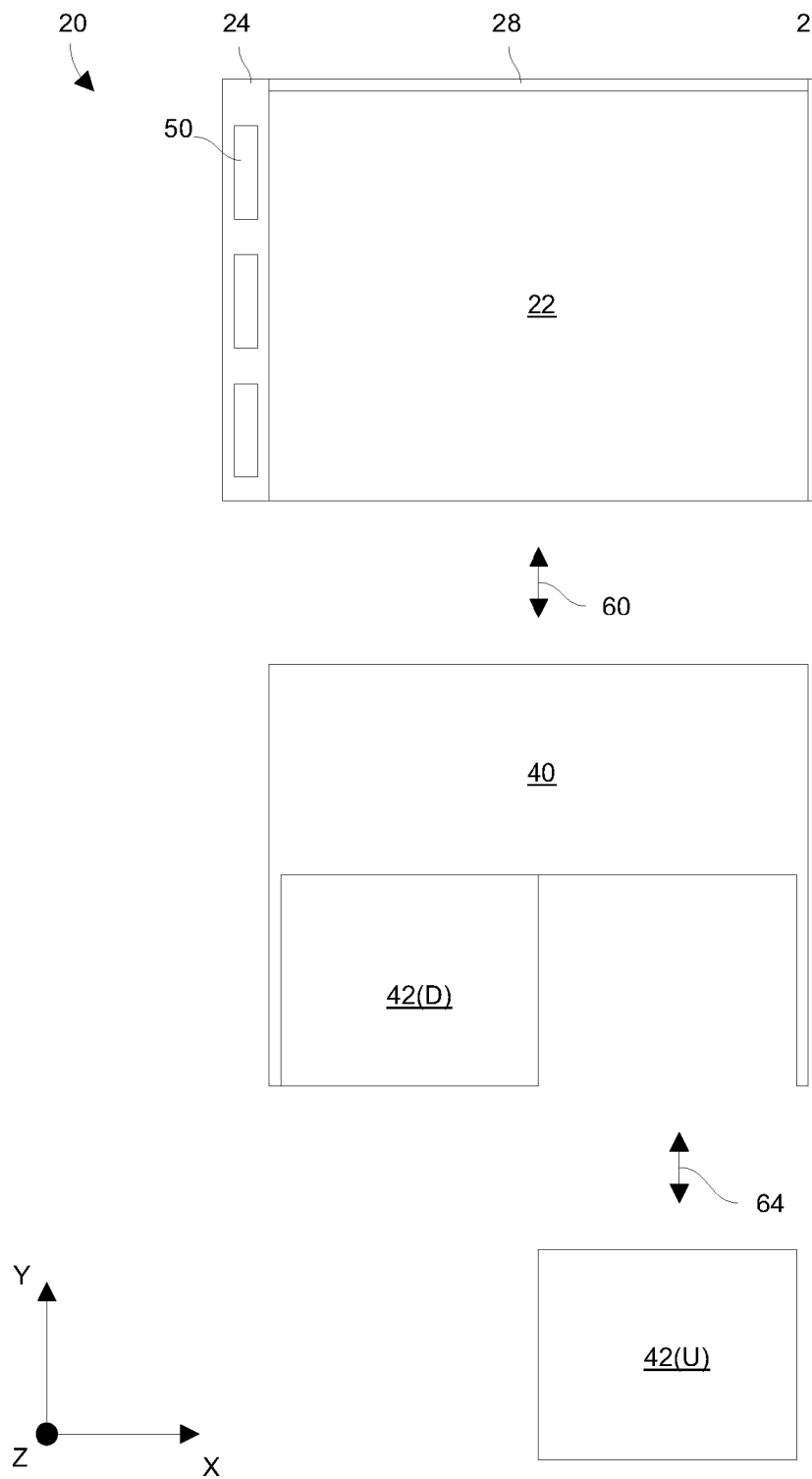
FIG. 3 is a general top view of particular modularized components of the electronic system of FIG. 1.
Figure 4:
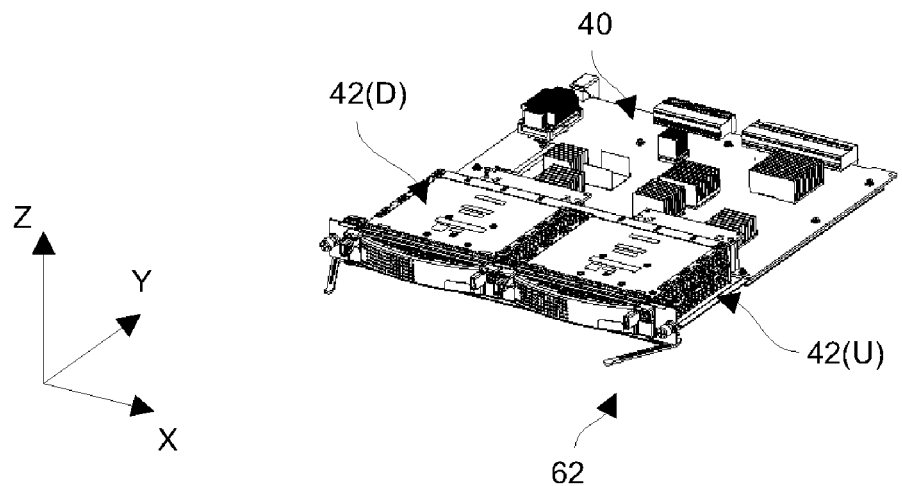
FIG. 4 is a detailed perspective view a main assembly of the electronic system of FIG. 1.
Figure 5:
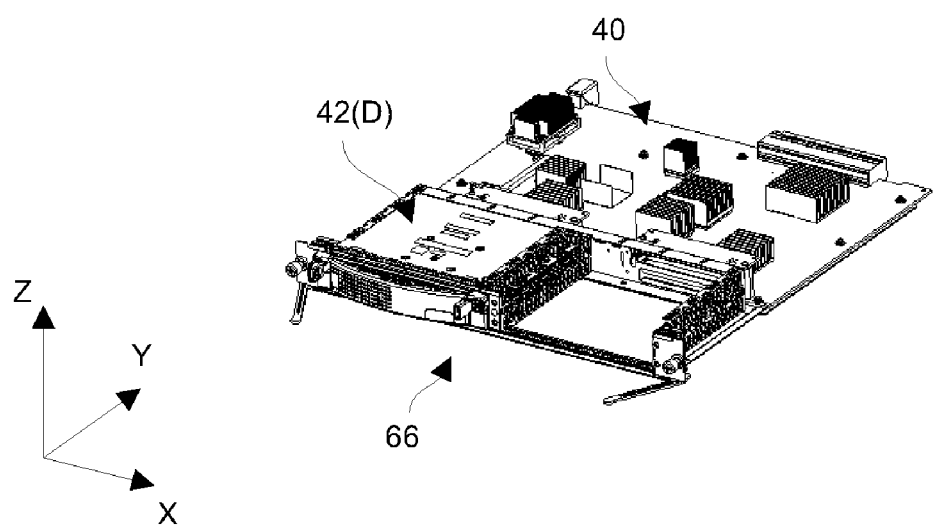
FIG. 5 is a detailed perspective view a main assembly of FIG. 4 with one of multiple pluggable electronic modules removed from the main assembly.

FIG. 3 is a general top view showing certain modularization features of the electronic system 20. FIG. 4 is a detailed perspective view a main assembly of the electronic system 20. FIG. 5 is a detailed perspective view the main assembly when one of the pluggable electronic modules 42 (e.g., the upstream pluggable electronic module 42(U)) is removed.

As shown in FIGS. 3 through 5, the main assembly 32 (i.e., the jacket circuit board 40 and modules 42) is arranged to insert into a cavity 32 of the chassis 22 and de-insert from the cavity 32 of the chassis 22 as illustrated by the arrow 60 along the Y-axis (FIG. 3). A set of levers 62 (FIG. 4) facilitate installation and removal of the main assembly 32 with respect to the chassis 20 (e.g., to evenly apply proper insertion/extraction forces). It should be understood that connection is made between the jacket circuit board 40 of the main assembly 32 and the interconnect 28 in a blind mating manner.

Similarly, each module 42 is arranged to install within and de-install from the jacket circuit board 40 as illustrated by the arrow 64 along the Y-axis (FIG. 3). A set of levers 66 (FIG. 5) facilitate installation and removal of each module 42 with respect to the jacket circuit board 40 (e.g., to evenly apply proper insertion/extraction forces). It should be understood that connection is also made between each module 42 and the jacket circuit board 40 in a blind mating manner.

By way of example, the jacket circuit board 40 operates as a network switch security module, and each module 42 operates as a shared port adapter (SPA) module thus forming a high performance device for firewall and virtual private network (VPN) services. In some arrangements, the main assembly 32 is hot-swappable with respect to the interconnect 28, and/or the modules 42 are hot-swappable with respect to the jacket circuit board 40. Further details of a module 42 will now be provided with reference to FIGS. 6 through 8.

Figure 6:
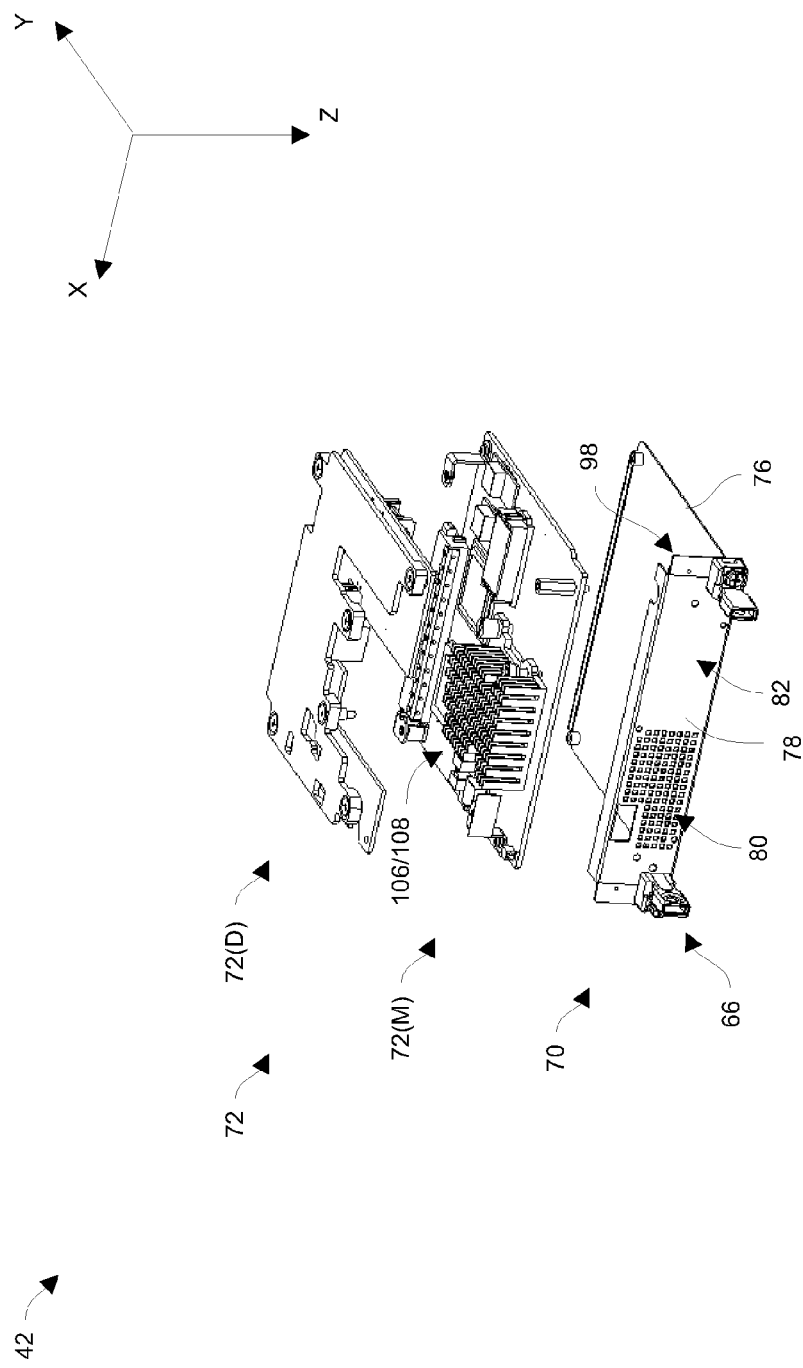
FIG. 6 is an exploded perspective view of portions of a pluggable electronic module.
Figure 8:
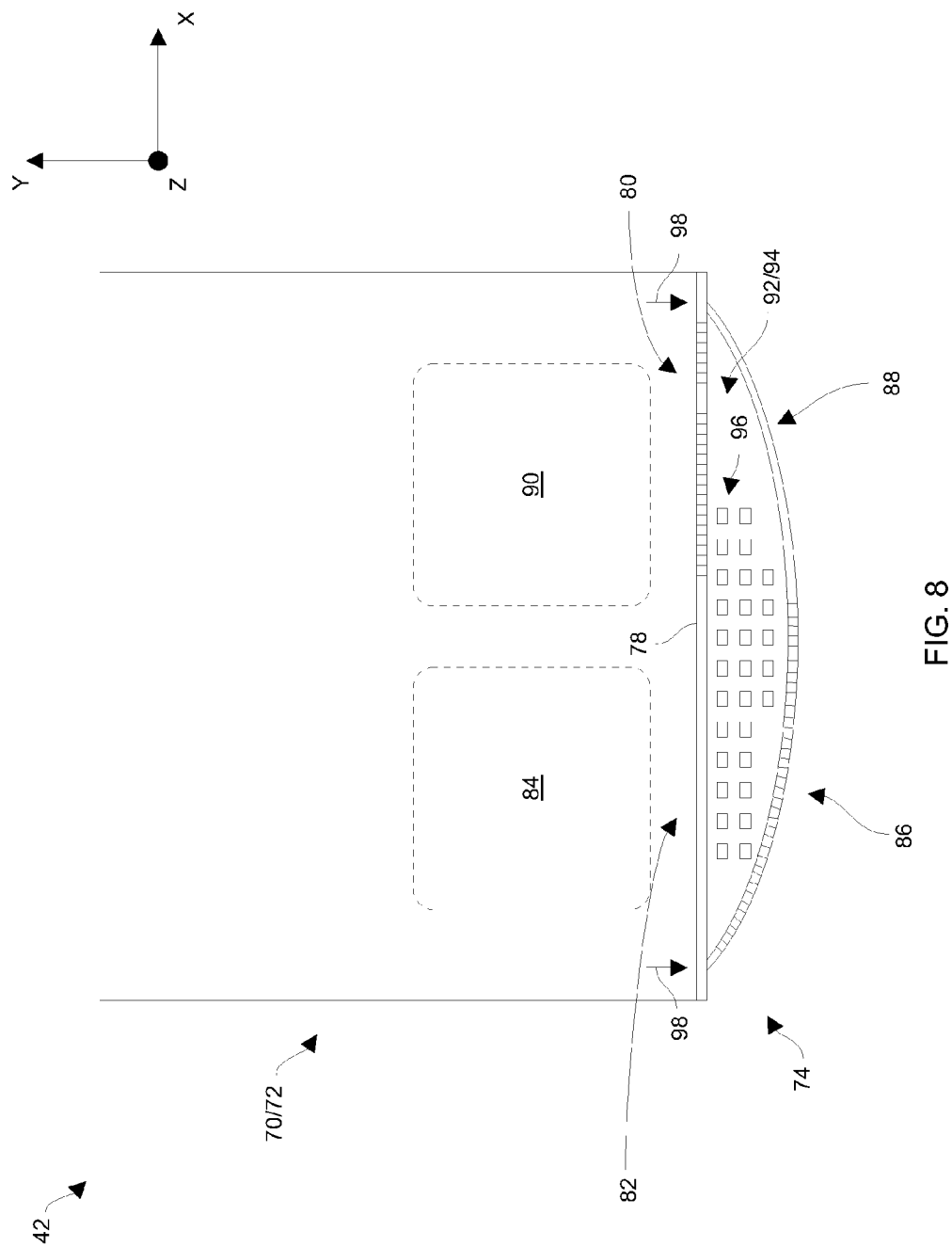
FIG. 8 is a general top view of the pluggable electronic module.

FIG. 6 shows particular portions of a pluggable electronic module 42. FIG. 7 is a bezel of the pluggable electronic module 42. FIG. 8 is a general top view of the pluggable electronic module 42 in assembled form. To better illustrate certain details of the pluggable electronic module 42, FIGS. 6 and 7 show the parts of the pluggable electronic module 42 at an inverted angle. Along these lines, it should be understood that the X, Y and Z axes shown in FIGS. 6 through 8 are intended to correspond to the same X, Y and Z axes in the other figures.

The pluggable electronic module 42 includes a support assembly 70 (FIG. 6), a set of electronic circuit boards 72(M), 72(D) (collectively, circuit boards 72) (FIG. 7), and a bezel 74 (FIG. 8). The support assembly 70 includes a metallic tray 76 and a perforated metallic face plate 78 (FIG. 6). When the various parts of the module 42 are assembled, the metallic tray 76, and each of the electronic circuit boards 72 stack in a substantially parallel manner, i.e., each extending horizontally along the X-Y plane, to match the orientation of the jacket circuit board 40 which also extends horizontally along the X-Y plane (also see FIG. 1). Accordingly, the various parts of the module 42 receive cooling from the air stream 34 as it flows laterally through the chassis 22.

The metallic tray 76 is arranged to rigidly engage the chassis 22 and support the circuit boards 72. Additionally, the metallic tray 76 provides a degree of EMI shielding between the cavities 32 in the Z-direction (also see FIG. 1).

Similarly, the perforated metallic face plate 78 (FIG. 6) is arranged to support the bezel 74 and the levers 66 (also see FIG. 5), as well as rigidly connect to the metallic tray 76 thus extending the EMI shielding to the front of the module 72 and enabling a user to maneuver the module 42 (e.g., install the module into the chassis 22 and remove the module 42 from the chassis 22) by operating the levers 66. In some arrangements, the metallic tray 76 and the perforated metallic face plate 78 are formed from a common section of sheet metal stock thus forming a sturdy and durable integrated support member.

As shown in FIGS. 6 and 8, the perforated metallic face plate 78 is elongated along the X-axis and defines an array of face plate perforations 80 and a non-perforated face plate section 82 having a substantially uniform surface. The array of face plate perforations 80 allows ambient air to pass through the perforated metallic face plate 78 for augmented cooling of the circuit board components of the circuit boards 72 which are immediately adjacent the array of face plate perforations 80. Additionally, the non-perforated face plate section 82 provides a visual barrier (i.e., visual shielding) that prevents viewing of components of the circuit boards 72 which are immediately behind the non-perforated face plate section 82, e.g., see the area 84 in FIG. 8.

Similarly, as shown in FIGS. 7 and 8, the bezel 74 is elongated along the X-axis and defines an array of bezel perforations 86 and a non-perforated bezel section 88 having a substantially uniform surface. The array of bezel perforations 86 allows ambient air to pass through the bezel 74 and reach the perforated metallic face plate 78. Furthermore, the non-perforated bezel section 88 provides a visual barrier that prevents viewing of any objects which are immediately behind the non-perforated bezel section 88, e.g., see the area 90 in FIG. 8.

When the bezel 74 is properly in place relative to the perforated metallic face plate 78, the arrays of perforations are at opposite ends (see FIG. 8). That is, the array of bezel perforations 86 is in front of or overlays the non-perforated face plate section 82, and the non-perforated bezel section 88 is in front of or overlays the array of face plate perforations 80. As a result, the combination of the bezel 74 and the perforated metallic face plate 78 robustly and reliably conceal the circuit boards 72 from view. Accordingly, the module 72 is capable of providing visual security against undesired viewing, e.g., FIPS compliance.

Nevertheless, the perforations enable air at the front of the module 42 to pass therethrough thus offering a thermal friendly solution particularly if the circuit boards 72 include critical circuitry 72 that may not be able to receive adequate cooling from only air entering through the filter assembly 26. In some arrangements, the top 92 and bottom 94 sections of the bezel 74 (opposite the top 92 on the other side of the bezel 74 across from the sections 86, 88) define further perforations 96 which are disposed proximate to the array of bezel perforations 86 for additional airflow. The locations of such perforations 96 do not provide a problematic line of sight to the components of the circuit boards 72 thus maintaining acceptable visual security.

In some arrangements, the bezel 74 has a curved contour in contrast to a substantially flat configuration for the face plate 78. Such arrangements, enable concurrent fulfillment of thermal, EMI and FIPS requirements in an advantageous and aesthetic manner.

Moreover, in some arrangements, the bezel 74 mounts to the face plate 78 via a set of screws 98 (shown generally as arrows 98 pointing towards the bezel 74 in FIGS. 6 and 8 for simplicity) which initially thread from the face plate 78 are which are not accessible through the front of the bezel 74. Accordingly, the set of screws 98 prevents a user from removing the bezel 74 while the module 72 is in operation, i.e., the set of screws prevents detachment of the bezel 74 from the face plate 78 while the module 72 electronically connects with the jacket circuit board 40 through the front 38 of the chassis 22.

In some arrangements, the bezel 74 is free of metallic material to reduce thermal conductivity for user safety. For example, the bezel 74 is capable of being formed of a polymer material to inhibit heat conduction from the metallic face plate 78 to the bezel 74. Accordingly, such arrangements avoid significant heat conduction from the metallic face plate 78 to the bezel 74 which could otherwise result in a user safety concern.

In other arrangements, the bezel 74 further includes metallic material (e.g., a metallic paint or coating) to provide additional EMI shielding. If a means of protection for the user exists, the bezel 74 is capable of being formed of metal for enhanced heat dissipation. Further details will now be provided with reference to FIG. 9 in combinations with the FIGS. 6 through 8.

Figure 9:
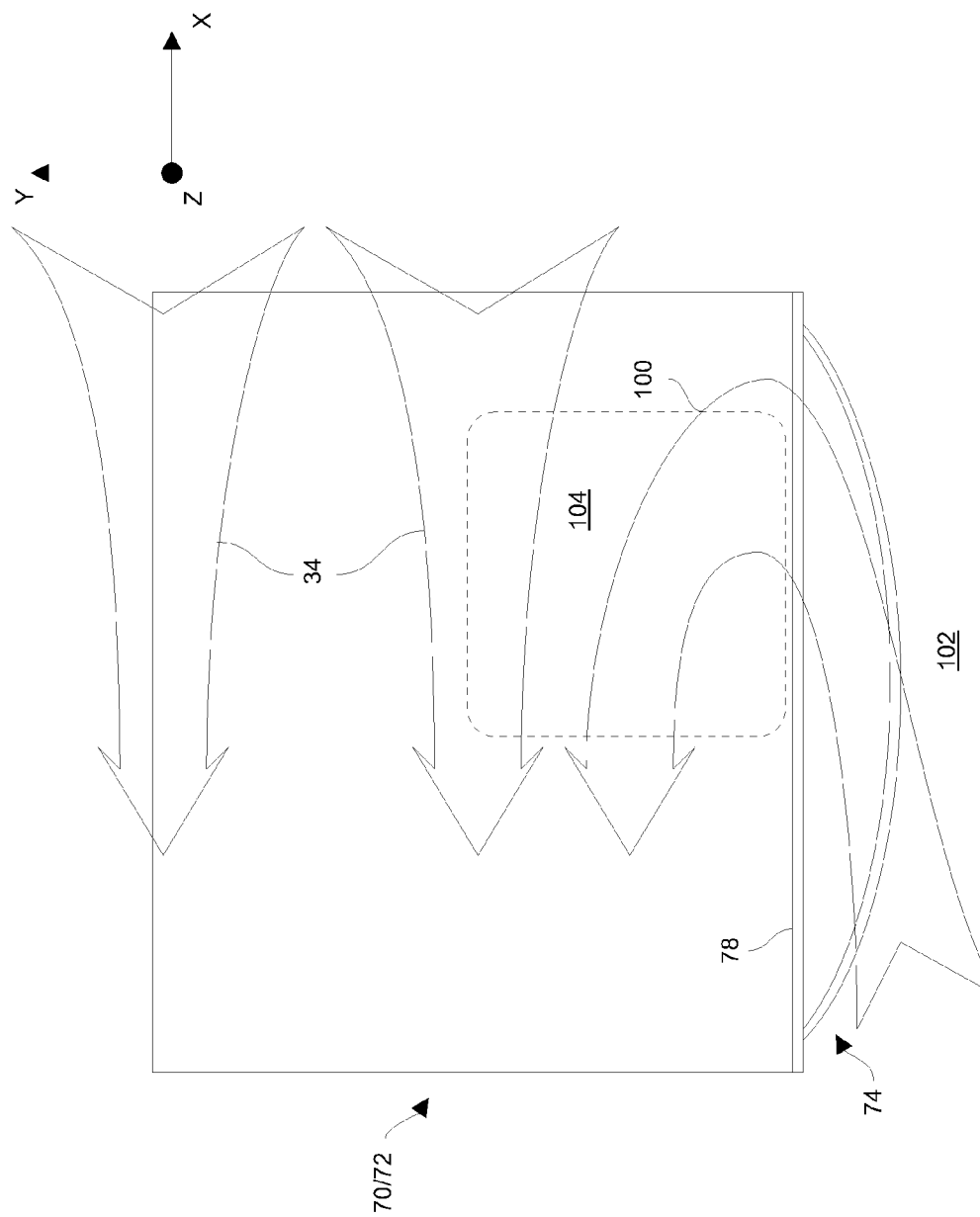
FIG. 9 is a view of the pluggable electronic module showing controlled air flow through the bezel and a perforated face plate in combination with a portion of an existing air stream.

FIG. 9 generally shows air flow patterns with respect to the module 42 when the module 42 is properly installed within the chassis 22. As shown, the module 42 enjoys cooling from both the air stream 34 as well as from additional air flow 100 through the front 102 of the module 42. With the resulting augmented air flow, enhanced cooling occurs at the location 104 which generally corresponds to the area 90 immediately in front of the array of face plate perforations 80 and slightly downstream from that area 90 (FIG. 8). Accordingly, the location 104 is particularly well-suited for temperature critical components that may not be able to receive adequate cooling from the air through the filter assembly 26 alone (also see circuitry 52 in FIG. 2).

For example, in some arrangements, the circuit board 72(M) is configured as a motherboard having a relatively high power processing circuit 106 disposed in the location 104 (see FIGS. 6 and 9). In such a situation, further suppose that the processing circuit 100 includes a heat sink 108 which is adjacent the perforated face plate section 80 of the perforated face plate 78. Furthermore, in these arrangements, the circuit board 72(D) is a daughter card having relatively high speed memory in support of operation of the processing circuit 106.

In the above-described particular arrangements, the motherboard 72(M) is tightly disposed between the metallic tray 76 and the daughter card 72(D). Even so, the additional air flow 100 passing through the front 102 of the module 72, in combination with the air stream 34 originating from the air intake side 36(I) of the chassis 22, is sufficient to provide adequate cooling to all of the circuitry of the module 42. It should be understood that experimental data has been accumulated which demonstrates that such cooling reliably occurs regardless of whether the module 42 is installed as the upstream pluggable electronic module 42(U) or the downstream pluggable electronic module 42(D).

As described above, an improved electronic system 20 utilizes a set of thermal, EMI and FIPS friendly electronic modules 42 which are capable of maintaining EMI and FIPS protection as well as providing supplemental ventilation though which air passes to augment an air stream 34 within the system 20. Such a system 20 enjoys robust and reliable compliance with thermal, EMI and FIPS requirements during operation.

While various embodiments of the invention have been particularly shown and described, it will be understood by those skilled in the art that various changes in form and details may be made therein without departing from the spirit and scope of the invention as defined by the appended claims.

For example, it should be understood that the electronic system 20 was described as including two modules 42 by way of example only. In other arrangements, each jacket circuit board 40 is capable of receiving a different number of modules 42, e.g., one, three, four, and so on.

Additionally, it should be understood that the orientation for the main assemblies 30 was described above as being lateral/horizontal by way of example. In other arrangements, the main assemblies 30, and thus the air stream 34, are oriented differently (e.g., bottom to top, front to back, etc.).

What is claimed is:

1. An electronic system, comprising:
a chassis which defines a substantially plane-shaped cavity, the chassis being arranged to contain an air stream which flows from an air intake side of the chassis to an air exhaust side of the chassis through the substantially plane-shaped cavity, the air intake side of the chassis being opposite the air exhaust side of the chassis;
a jacket circuit board disposed within the plane-shaped cavity, the jacket circuit board being oriented within the plane-shaped cavity to receive cooling from the air stream; and
a set of pluggable electronic modules, each pluggable electronic module being arranged to (i) electronically connect to the jacket circuit board through a front of the chassis and (ii) define a supplemental ventilation port through which air passes to augment the air stream.

2. An electronic system as in claim 1 wherein each pluggable electronic module includes:
a set of electronic circuit boards which is arranged to receive cooling from the air stream when the pluggable electronic module electronically connects with the jacket circuit board through the front of the chassis;
a perforated face plate coupled to the set of electronic circuit boards, the perforated face plate being arranged to provide electromagnetic interference shielding while concurrently allowing air to substantially pass therethough; and
a bezel coupled to the perforated face plate, the perforated face plate being arranged to provide visual shielding while concurrently allowing air to substantially pass therethough.

3. An electronic system as in claim 2 wherein the set of pluggable electronic modules includes:
an upstream pluggable electronic module proximate to the air intake side of the chassis and distal to the air exhaust side of the chassis; and
a downstream pluggable electronic module proximate to the air exhaust side of the chassis and distal to the air intake side of the chassis, the upstream and downstream pluggable electronic modules abutting each other when each electronically connects with the jacket circuit board through the front of the chassis.

4. An electronic system as in claim 3 wherein the substantially plane-shaped cavity defined by the chassis extends in a substantially horizontal plane to guide the air stream in a lateral direction;
wherein the jacket circuit board extends in the substantially horizontal plane to receiving cooling from the air stream;
wherein each of the upstream pluggable electronic module and the downstream pluggable electronic module includes (i) a motherboard which is disposed horizontally when electronically connecting to the jacket circuit board, (ii) a daughter card which is disposed horizontally when electronically connecting to the jacket circuit board, and (iii) a metallic tray which is disposed horizontally when electronically connecting to the jacket circuit board, the motherboard being disposed between the metallic tray and the daughter card in a parallel manner to enable laminar air stream flow through each of the upstream pluggable electronic module and the downstream pluggable electronic module.

5. An electronic system as in claim 2 wherein, for each pluggable electronic module:
the perforated face plate of that module is elongated and defines a perforated face plate section having an array of perforations and a non-perforated face plate section having a substantially uniform surface, and
the bezel of that module is elongated to overlay the perforated face plate of that module and defines (i) a perforated bezel section having an array of perforations, the perforated bezel section overlaying the non-perforated face plate section of the perforated face plate, and (ii) a non-perforated bezel section having a substantially uniform surface, the non-perforated bezel section overlaying the perforated face plate section of the perforated face plate.

6. An electronic system as in claim 5 wherein, for each pluggable electronic module, the set of electronic circuit boards of that module has a processing circuit disposed in a location which is adjacent the perforated face plate section of the perforated face plate of that module to dissipate heat from the processing circuit into air passing through that perforated face plate section as that air augments the air stream.

7. An electronic system as in claim 2 wherein, for each pluggable electronic module, (i) the perforated face plate of that module is substantially flat, and (ii) the bezel of that module is curved.

8. An electronic system as in claim 7 wherein, for each pluggable electronic module, the bezel of that module defines (i) a front having the perforated bezel section and the non-perforated bezel section of the bezel of that module, (ii) a top section, and (iii) a bottom section which is opposite the top section, the top and bottom sections defining perforations.

9. An electronic system as in claim 2 wherein, for each pluggable electronic module, (i) the perforated face plate of that module includes metallic material, and (ii) the bezel of that module includes a polymer material to inhibit heat conduction from the perforated face plate to the bezel.

10. An electronic system as in claim 2 wherein, for each pluggable electronic module, the bezel of that module includes metallic material to provide electromagnetic interference shielding.

11. An electronic system as in claim 2 wherein each pluggable electronic module further comprises a set of screws which thread from the perforated face plate of that module into the bezel of that module to prevent detachment of the bezel from the perforated face plate while that module electronically connects with the jacket circuit board through the front of the chassis.

12. A pluggable electronic module to electronically connect to a jacket circuit board through a front of a chassis, the pluggable electronic module comprising:
a set of electronic circuit boards which is arranged to receive cooling from an air stream in the chassis when the pluggable electronic module electronically connects with a jacket circuit board through the front of the chassis, the air stream flowing from an air intake side of the chassis to an air exhaust side of the chassis which is opposite the air intake side of the chassis;
a perforated face plate coupled to the set of electronic circuit boards, the perforated face plate being arranged to provide electromagnetic interference shielding; and
a bezel coupled to the perforated face plate, the perforated face plate being arranged to provide visual shielding, the perforated face plate and the bezel forming a supplemental ventilation port which allows air to substantially pass therethough to augment the air stream in the chassis.

13. A pluggable electronic module as in claim 12 wherein the set of electronic circuit boards includes a motherboard, a daughter card, and a metallic tray which are disposed substantially parallel to each other to enable laminar air stream flow through the module, the motherboard residing between the metallic tray and the daughter card.

14. A pluggable electronic module as in claim 13 wherein the perforated face plate of is elongated and defines a perforated face plate section having an array of perforations and a non-perforated face plate section having a substantially uniform surface; and
wherein the bezel is elongated to overlay the perforated face plate and defines (i) a perforated bezel section having an array of perforations, the perforated bezel section overlaying the non-perforated face plate section of the perforated face plate, and (ii) a non-perforated bezel section having a substantially uniform surface, the non-perforated bezel section overlaying the perforated face plate section of the perforated face plate.

15. A pluggable electronic module as in claim 14 wherein the set of electronic circuit boards includes a processing circuit disposed in a location which is adjacent the perforated face plate section of the perforated face plate to dissipate heat from the processing circuit into air passing through that perforated face plate section as that air augments the air stream in the chassis.

16. A pluggable electronic module as in claim 12 wherein the perforated face plate of that module is substantially flat, and the bezel of that module is curved.

17. A pluggable electronic module as in claim 16 wherein the bezel defines (i) a front having the perforated bezel section and the non-perforated bezel section of the bezel, (ii) a top section, and (iii) a bottom section which is opposite the top section, the top and bottom sections defining perforations.

18. A pluggable electronic module as in claim 12 wherein the perforated face plate includes metallic material, and the bezel includes a polymer material to inhibit heat conduction from the perforated face plate to the bezel.

19. A pluggable electronic module as in claim 12 wherein the bezel includes metallic material to provide electromagnetic interference shielding.

20. A pluggable electronic module as in claim 12, further comprising:
a set of screws which thread from the perforated face plate into the bezel of that module to prevent detachment of the bezel from the perforated face plate while the module electronically connects with the jacket circuit board through the front of the chassis.

\* \* \* \* \*

UNITED STATES PATENT AND TRADEMARK OFFICE
CERTIFICATE OF CORRECTION

PATENT NO. : 7,643,290 B1
APPLICATION NO. : 12/178060
DATED : January 5, 2010
INVENTOR(S) : Susheela N. Narasimhan et al.

It is certified that error appears in the above-identified patent and that said Letters Patent is hereby corrected as shown below:

Title Page, Heading (65), should read: -- (65)     Prior Publication Data
US 2010/0020486 A1   Jan. 28, 2010 --

Signed and Sealed this

Thirtieth Day of March, 2010

David J. Kappos
*Director of the United States Patent and Trademark Office*